United States Patent [19]
Bryant et al.

[11] Patent Number: 5,959,335
[45] Date of Patent: Sep. 28, 1999

[54] DEVICE DESIGN FOR ENHANCED AVALANCHE SOI CMOS

[75] Inventors: Andres Bryant; William F. Clark, both of Essex Junction; John J. Ellis-Monaghan, Grand Isle; Edward P. Maciejewski, Burlington; Edward J. Nowak, Essex Junction; Wilbur D. Pricer, Charlotte; Minh H. Tong, Essex Junction, all of Vt.

[73] Assignee: International Business Machines Corporation, Armonk, N.Y.

[21] Appl. No.: 09/159,307

[22] Filed: Sep. 23, 1998

[51] Int. Cl.$^6$ .......................... H01L 29/76; H01L 29/94; H01L 31/062; H01L 31/113
[52] U.S. Cl. .......................................... 257/379; 257/380
[58] Field of Search ....................... 257/379, 380

[56] References Cited

U.S. PATENT DOCUMENTS

| | | |
|---|---|---|
| 4,875,151 | 10/1989 | Ellsworth et al. . |
| 5,079,605 | 1/1992 | Blake . |
| 5,144,390 | 9/1992 | Matloubian . |
| 5,185,280 | 2/1993 | Houston et al. . |
| 5,317,181 | 5/1994 | Tyson . |
| 5,378,919 | 1/1995 | Ochiai . |
| 5,400,277 | 3/1995 | Nowak . |
| 5,413,313 | 5/1995 | Mutterlein et al. . |
| 5,424,225 | 6/1995 | Yamaguchi et al. . |
| 5,489,792 | 2/1996 | Hu et al. . |
| 5,491,357 | 2/1996 | Zambrano . |
| 5,591,650 | 1/1997 | Hsu et al. . |
| 5,594,371 | 1/1997 | Douseki . |
| 5,610,083 | 3/1997 | Chan et al. . |

*Primary Examiner*—Stephen D. Meier
*Attorney, Agent, or Firm*—Scully, Scott, Murphy & Presser; Eugene I. Shkurko, Esq.

[57] ABSTRACT

A device design for an FET in SOI CMOS which is designed for enhanced avalanche multiplication of current through the device when the FET is on, and to remove the body charge when the FET is off. The FET has an electrically floating body and is substantially electrically isolated from the substrate. The present invention provides a high resistance path coupling the floating body of the FET to the source of the FET, such that the resistor enables the device to act as a floating body for active switching purposes and as a grounded body in a standby mode to reduce leakage current. The high resistance path has a resistance of at least 1 M-ohm, and comprises a polysilicon resistor which is fabricated by using a split polysilicon process in which a buried contact mask opens a hole in a first polysilicon layer to allow a second polysilicon layer to contact the substrate.

11 Claims, 3 Drawing Sheets

DEVICE DESIGN FOR ENHANCED AVALANCHE SOI CMOS

BACKGROUND OF THE INVENTION

TECHNICAL FIELD

The present invention relates generally to a device design for an FET (Field Effect Transistor) in SOI CMOS (Silicon On Insulator Complementary Metal Oxide Semiconductor) which is designed for enhanced avalanche multiplication of current through the device when the FET is on, and to remove the body charge when the FET is off.

SUMMARY OF THE INVENTION

Accordingly, it is a primary object of the present invention to provide a device design for SOI CMOS which enhances the avalanche multiplication of current through the device when the FET is on, and removes the body charge when the FET is off.

The threshold voltage of SOI devices can be altered by changing the body-source potential. The present invention concerns an SOI device design which has a low threshold voltage (Vt) while the device is switching and on, and a high threshold voltage (Vt) when the device is off. The subject invention achieves this mode of operation by charging the body by avalanche multiplication current, and discharging the body through a high impedance.

The drain of the SOI device is designed and engineered to enhance avalanche multiplication of current through the device. A high value resistor is placed between the body contact and the source, and the value of the resistor is selected, preferably above 1 M-ohm, to enable the device to act as a floating body SOI for AC (active switching) purposes and as a grounded body SOI for DC (standby mode in which the grounding reduces leakage) purposes.

In accordance with the teachings herein, the present invention provides a field effect transistor fabricated in a substrate with a source, drain and gate, wherein the field effect transistor has an electrically floating body and is substantially electrically isolated from the substrate. The present invention provides a high resistance path coupling the floating body of the field effect transistor to the source of the field effect transistor, such that the resistor enables the device to act as a floating body for active switching purposes and as a grounded body in a standby mode to reduce leakage current.

In greater detail, the high resistance path has a resistance of at least 1 M-ohm, and the transistor is fabricated in SOI CMOS. The resistor comprises a polysilicon resistor which is fabricated by using a split polysilicon process in which a buried contact mask opens a hole in a first polysilicon layer to allow a second polysilicon layer to contact the body of the FET.

The resistor polysilicon is advantageously patterned at the same time as the gate polysilicon with the same application of a PC mask. The PC mask preferably comprises a nitride hardmask which prevents silicidation of the polysilicon gate layer and prevents penetration of the source and drain ion implants, such that the polysilicon remains unsilicided and lightly doped to provide a high resistance path for the body charge to the source. The usual source/drain doping block masks are used to dope the ends of the OP resistor n+ or p+ to make good contacts to the n and p regions of the silicon, respectively.

Moreover, the drain is designed to provide for enhanced avalanche multiplication of current through the device. The drain region is implanted with a relatively high dose halo implant, which results in an extremely abrupt junction to enhance the avalanche multiplication current through the device. Most of the drain is masked prior to implanting the high dose halo implant. Alternatively, the implant is performed over the entire width of the drain.

BRIEF DESCRIPTION OF THE DRAWINGS

The foregoing objects and advantages of the present invention for a device design for enhanced avalanche SOI CMOS may be more readily understood by one skilled in the art with reference being had to the following detailed description of a preferred embodiment thereof, taken in conjunction with the accompanying drawings wherein like elements are designated by identical reference numerals throughout the several views, and in which:

FIGS. 5 and 6 illustrate a split polysilicon buried contact process, wherein FIG. 5 is a cross section through a buried contact area, and FIG. 6 illustrates poly 2 doped with the source and drain ion implants for proper contact to p+ and n+ diffusions, wherein an OP nitride mask blocks these implants, providing a high resistance.

DETAILED DESCRIPTION OF THE DRAWINGS

Figure 1:
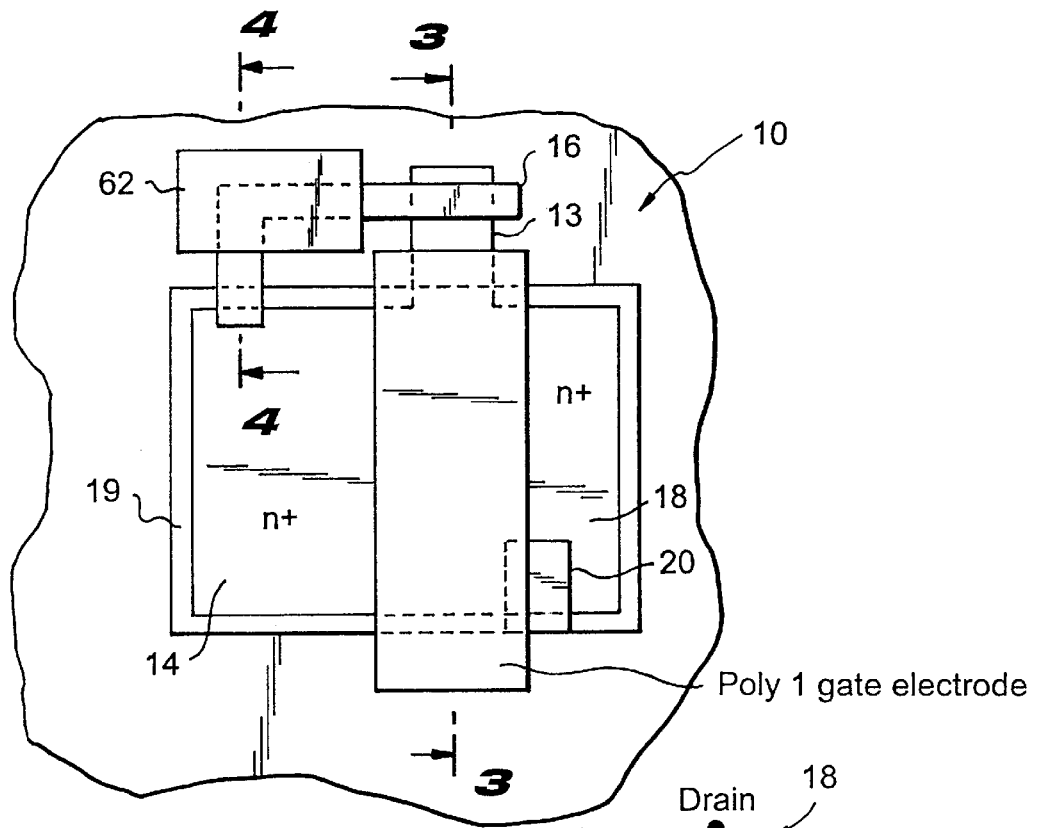
FIG. 1 is a top plan view of a device design for SOI CMOS which is designed to enhance the avalanche multiplication of current through the device, and further includes a bleeder resistor.

Referring to the drawings in detail, FIG. 1 is a top plan view of an SOI CMOS device 10 which includes a substrate or body 12 having a body contact 13, a source region 14 and a drain region 18, and wherein the substrate or body 12 is connected to the source 14 through a poly 2 bleeder resistor 16. The resistor 16 is constructed on the SOI device by using a split poly process in which a buried contact mask 54, FIG. 5, is used to open a hole 56 in a polysilicon 1 layer 52 to allow the gate poly 2 layer 60, FIG. 6, to contact the substrate 26.

Split poly buried contact processes are well known in the art, and are briefly described with reference to FIGS. 5 and 6.

Figure 3:
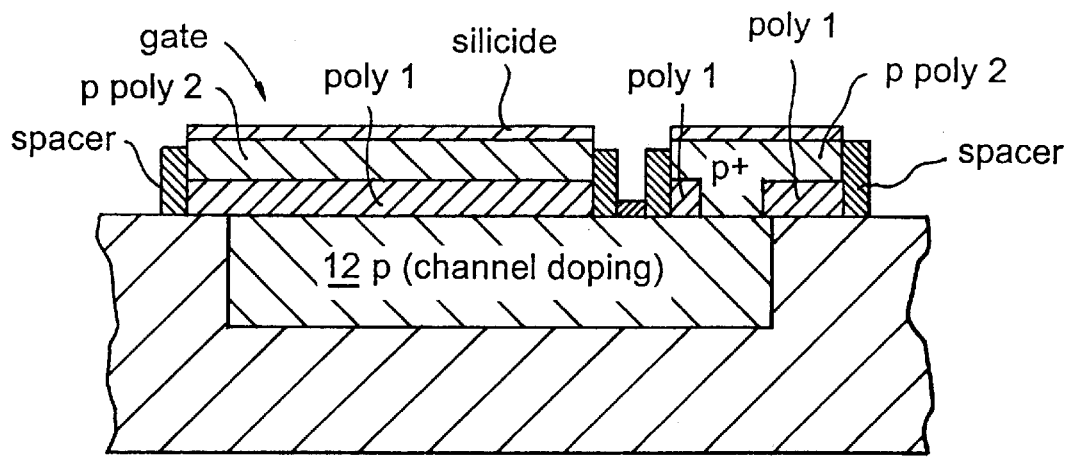
FIG. 3 is a cross sectional view, taken along arrows 3—3 in FIG. 1, showing a buried contact and resistor poly.
Figure 4:
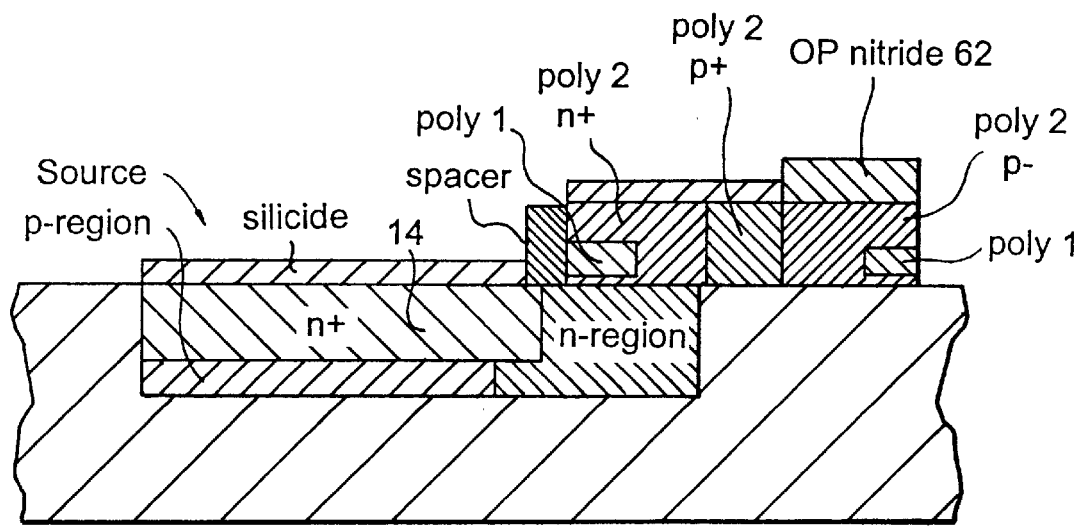
FIG. 4 is a cross sectional view, taken along arrows 4—4 in FIG. 1, showing a buried contact to n+ diffusion and an OP nitride mask.
Figure 5:
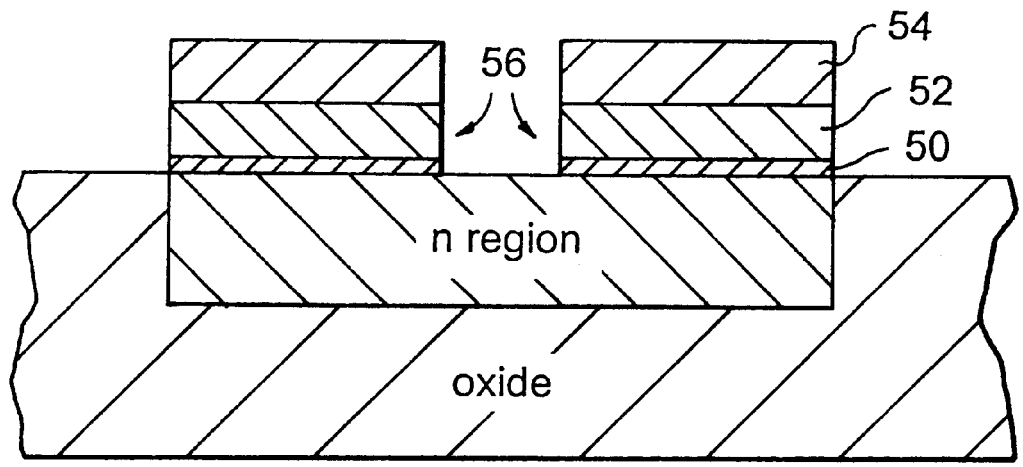

FIG. 5 is an illustration of a split poly process showing a cross section through a buried contact area. Referring thereto, initially the regions to become buried contact areas to the body (FIG. 3) are doped p-type using the same photo-mask and implants used to dope the n-MOSFET body p-type. Similarly, the n-regions of silicon to become buried contacts to n-sources (FIG. 4) are doped n-type by the use of the same photo-mask and implants used to dope the p-MOSFET body n-type. A gate oxide layer 50 is then grown on the substrate, followed by deposition of a polysilicon 1 layer 52 approximately 100 nm thick, followed by deposition of a patterned buried contact mask 54, followed by etching of the polysilicon 1 layer through the patterned mask, followed by etching of the gate oxide through the patterned mask, to achieve the structure of FIG. 5.

Figure 6:
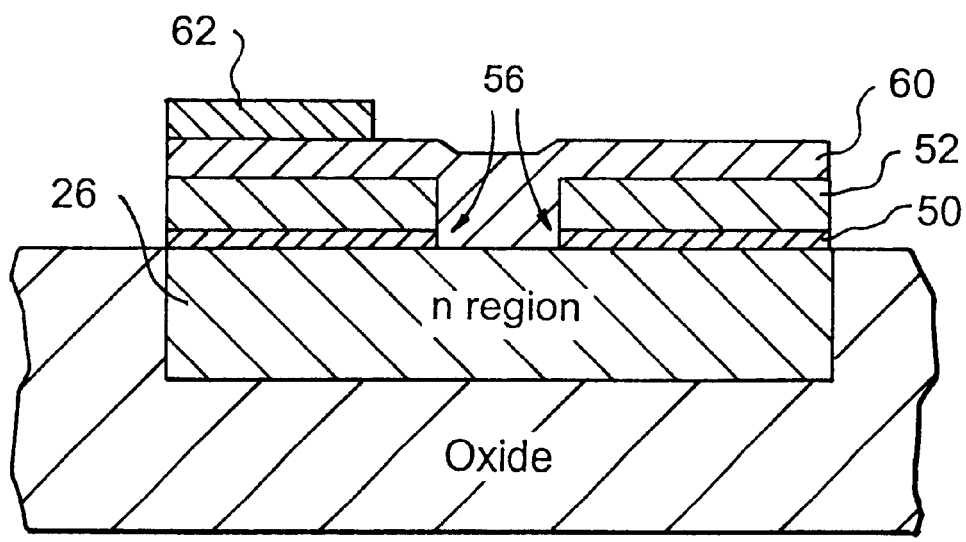

The buried contact mask 54 is then removed by etching, leaving the patterned poly 1 layer 52 and gate oxide layer 50 with a hole 56 therethrough, as shown in FIG. 6. A lightly doped layer 60 of gate polysilicon 2 is then deposited over the patterned poly 1 layer 52 and gate oxide layer 50, followed by deposition of an OP nitride layer, which is then patterned with photoresist to form the gate mask 62. The gate is then etched through the gate mask 62, followed by removal of the gate mask. This is followed by patterning of the OP nitride mask with a second photoresist and etching of the OP nitride through the OP mask, and then removal of the OP mask, to achieve the structure of FIG. 6.

Referring to FIG. 6, the poly 2 layer 60 is doped with the source and drain ion implants for proper contact to p+ and n+ diffusions. The OP mask blocks these implants, providing a high resistance.

The resistor poly 16 is patterned at the same time as the gate poly 60 (i.e. same application of the PC mask). This process uses an OP nitride hardmask 62 which has two functions 1) prevent silicidation of the polysilicon gate layer, and 2) prevent penetration of the source and drain ion implants. In this way the polysilicon remains unsilicided and intrinsically doped to provide a high resistance path 16 (Rsx) for the body charge to the source.

FIG. 1 illustrates a region in the drain 18 which is designed to provide for an enhanced avalanche current. This is achieved by masking most of the drain 18 and implanting a relatively high dose halo implant 20. This implant results in an extremely abrupt junction, which enhances the avalanche multiplication current through the device. This implant 20 may not require a mask if the device design and reliability concerns are such as to allow the implant in or over the entire width of the drain 18.

FIG. 4 illustrates the poly 2 doped from left to right n+, p+ and p−, which is achieved by the p+/n+ I/I (Ion Implant) mask 19 shown in FIG. 1.

Figure 2:
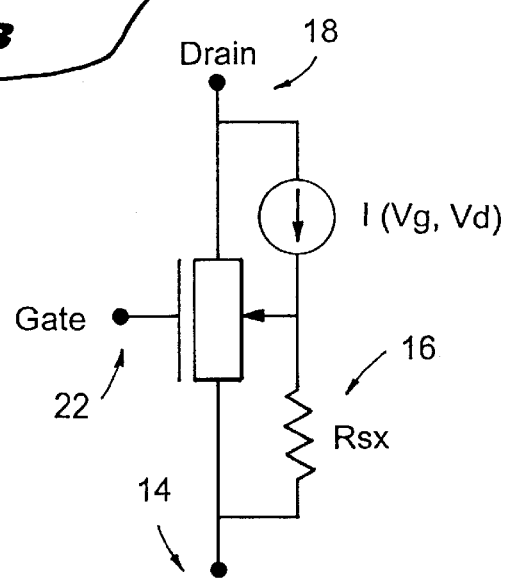
FIG. 2 is a circuit representation of the avalanche enhanced SOI NFET of FIG. 1.

FIG. 2 is a circuit representation of the device. The operation of this device is as follows. Consider a simple inverter where the drain 18 of the NFET is at Vdd and the gate 22 at Ov. Very little current is present and virtually no avalanche multiplication of the current. When the gate 22 is switched to Vdd, the drain current increases, and since the drain to source voltage is high relative to the gate, the device operates in saturation and significant avalanche multiplication of current through the device occurs. By choice of a suitably high value for $R_{sx}$, avalanche generated holes charge the body positively, thus lowering the threshold voltage of the NFET and increasing the overdrive to the device. The body potential is clamped to a forward-biased diode voltage (~0.6 volt) above the source. As the device enters the linear region of operation, the drain to source potential drops and avalanche multiplication of current ceases. The excess holes in the substrate either discharge through the resistor 16, or recombine, and the threshold of the device rises to its natural steady state value, thus reducing undesirable subthreshold leakage.

While several embodiments and variations of the present invention for a device design for enhanced avalanche SOI CMOS are described in detail herein, it should be apparent that the disclosure and teachings of the present invention will suggest many alternative designs to those skilled in the art.

Having thus described our invention, what we claim as new, and desire to secure by letters patent is:

1. In a field effect transistor fabricated in a substrate with a source, drain and gate, and wherein the field effect transistor has an electrically floating body and is substantially electrically isolated from the substrate, the improvement comprising a high resistance path coupling the floating body of the field effect transistor to the source of the field effect transistor, wherein the resistor enables the device to act as a floating body for active switching purposes and as a grounded body in a standby mode to reduce leakage current.

2. The field effect transistor of claim 1, wherein the high resistance path has a resistance of at least 1 M-ohm.

3. The field effect transistor of claim 1, wherein the transistor is fabricated in SOI CMOS.

4. The field effect transistor of claim 1, wherein the resistor comprises a polysilicon resistor.

5. The field effect transistor of claim 4, wherein the polysilicon resistor is constructed by using a split polysilicon process in which a buried contact mask opens a hole in a first polysilicon layer to allow a second polysilicon layer to contact the substrate.

6. The field effect transistor of claim 4, wherein the resistor polysilicon is patterned at the same time as the gate polysilicon with the same application of a PC mask.

7. The field effect transistor of claim 6, wherein the PC mask comprises a nitride hardmask which prevents silicidation of the polysilicon gate layer and prevents penetration of the source and drain ion implants, such that the polysilicon remains unsilicided and intrinsically doped to provide a high resistance path for the body charge to the source.

8. The field effect transistor of claim 1, wherein the drain provides for enhanced avalanche multiplication of current through the device.

9. The field effect transistor of claim 8, wherein the drain region is implanted with a relatively high dose halo implant, which results in an extremely abrupt junction to enhance the avalanche multiplication current through the device.

10. The field effect transistor of claim 9, wherein most of the drain is masked prior to implanting the high dose halo implant.

11. The field effect transistor of claim 8, wherein the implant is performed over the entire width of the drain.

\* \* \* \* \*